US006215659B1

(12) United States Patent
Chen

(10) Patent No.: US 6,215,659 B1
(45) Date of Patent: Apr. 10, 2001

(54) FAN HOUSING IN A COMPUTER ENCLOSURE

(75) Inventor: Chia Hua Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/472,755

(22) Filed: Dec. 27, 1999

(30) Foreign Application Priority Data

Oct. 12, 1999 (TW) .................................................. 88217278

(51) Int. Cl.[7] ...................................................... H05K 7/20
(52) U.S. Cl. .......................... 361/695; 361/690; 361/694; 174/15.1; 174/16.1; 165/80.3; 165/122; 165/185
(58) Field of Search ..................................... 361/687, 690, 361/694, 695, 696, 697; 174/16.1, 16.3; 165/80.3, 185; 312/223.2; 454/184

(56) References Cited

U.S. PATENT DOCUMENTS

| | | | |
|---|---|---|---|
| 4,751,872 | * | 6/1988 | Lawson, Jr. ........................... 361/685 |
| 5,101,321 | * | 3/1992 | Remise et al. ........................ 361/695 |
| 5,338,214 | * | 8/1994 | Steffes et al. ......................... 361/683 |
| 5,586,865 | * | 12/1996 | Yin ....................................... 165/80.3 |
| 5,788,566 | * | 8/1998 | McAnally et al. .................... 361/695 |
| 5,852,547 | * | 12/1998 | Kitlas et al. .......................... 361/695 |
| 5,917,698 | * | 6/1999 | Viallet .................................. 361/695 |
| 6,034,870 | * | 3/2000 | Osborn et al. ........................ 361/690 |
| 6,040,981 | * | 3/2000 | Schmitt et al. ....................... 361/695 |
| 6,061,237 | * | 5/2000 | Sands et al. .......................... 361/695 |

\* cited by examiner

Primary Examiner—Leo P. Picard
Assistant Examiner—Boris L. Chervinsky
(74) Attorney, Agent, or Firm—Wei Te Chung

(57) ABSTRACT

A fan housing attached to a computer enclosure for receiving a fan comprises two side walls and an end wall connected between the two side walls. Each side wall has a fixing edge adapted for abutting against the computer enclosure. The end wall is inclined relative to a plane in which the fixing edges of the side walls lie and is adapted for engaging with the fan.

7 Claims, 7 Drawing Sheets

FAN HOUSING IN A COMPUTER ENCLOSURE

BACKGROUND OF THE INVENTION

1. Field of the Invention

The present invention relates to a fan housing in a computer enclosure, and particularly to a fan housing in a computer enclosure having an inclined end wall for attaching a fan thereto.

2. Description of Prior Art

Heat produced within the computer enclosure increases due to increase in operational speed as the computer industry develops, which may increase an internal temperature of the computer enclosure and reduce stability of the computer system. To encounter the problem, it is desirable to dissipate the heat quickly by a heat dissipating system to guarantee that the computer system may operate in its normal temperature range. This will assure the quality of data operation, storage and transfer.

A heat dissipating system generally includes a first fan within a power supply, a second fan attached to a central processing unit and a third fan attached to a bottom corner of the computer enclosure. A conventional fan housing for receiving the third fan forms a vertical end wall for fixing the third fan, thus the third fan draw air and horizontally flow through a bottom portion of a mother board. However, the central processing unit mounted proximate a central portion of the mother board is a main heat source in a computer enclosure. A conventional fan housing cannot make the third fan draw air to flow through the central processing unit, thereby reducing the efficiency of the third fan.

Thus, it is desired to provide an improved fan housing which increases the efficiency of the heat dissipation within the computer enclosure by adjusting the driving angle of the third fan.

SUMMARY OF THE INVENTION

Accordingly, an object of the present invention is to provide a fan housing to receive a fan for efficiently dissipating heat away from a heat generating element.

Second object of the present invention is to provide a fan housing having a single structure for receiving a fan.

Third object of the present invention is to provide a fan housing having a single structure for being readily assembled within a computer enclosure.

In a preferred embodiment of the present invention, a fan housing attached to a computer enclosure for receiving a fan comprises two side walls and an end wall connected between the two side walls. Each side wall has a fixing edge adapted for abutting against the computer enclosure. The end wall is inclined relative to a plane in which the fixing edges of the side walls lie and is adapted for engaging with the fan.

BRIEF DESCRIPTION OF THE DRAWINGS

Other objects and advantages of the present invention will be understood from the following description of a fan housing in a computer enclosure according to preferred embodiments of the present invention shown in the accompanying drawings, in which.

DETAILED DESCRIPTION OF THE PREFERRED EMBODIMENT

Figure 1:
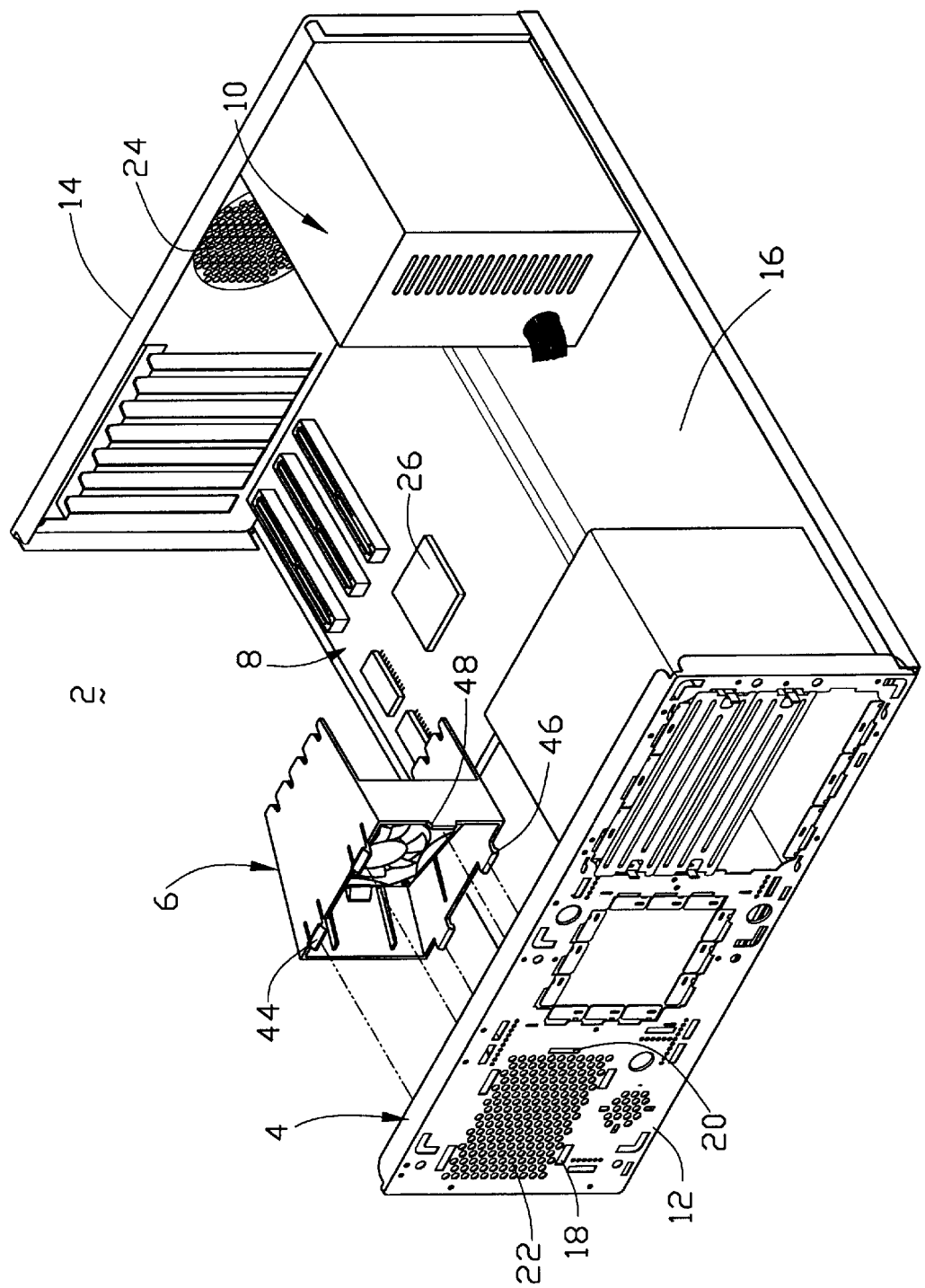
FIG. 1 is a perspective view of a part of a computer enclosure with a mother board mounted thereon and a fan assembly of the present invention detached from the enclosure.
Figure 2:
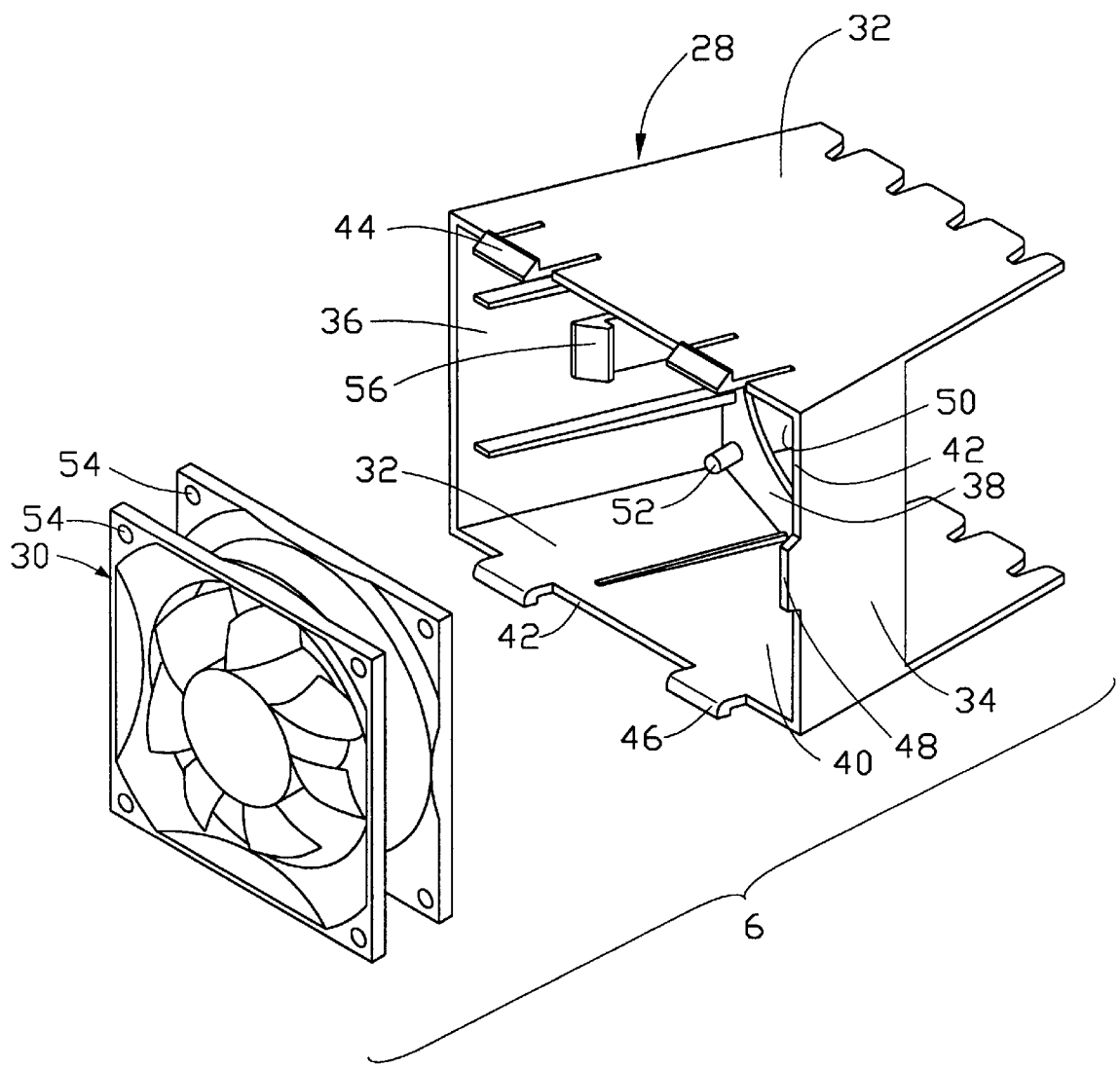
FIG. 2 is an exploded view of the fan assembly.
Figure 3:
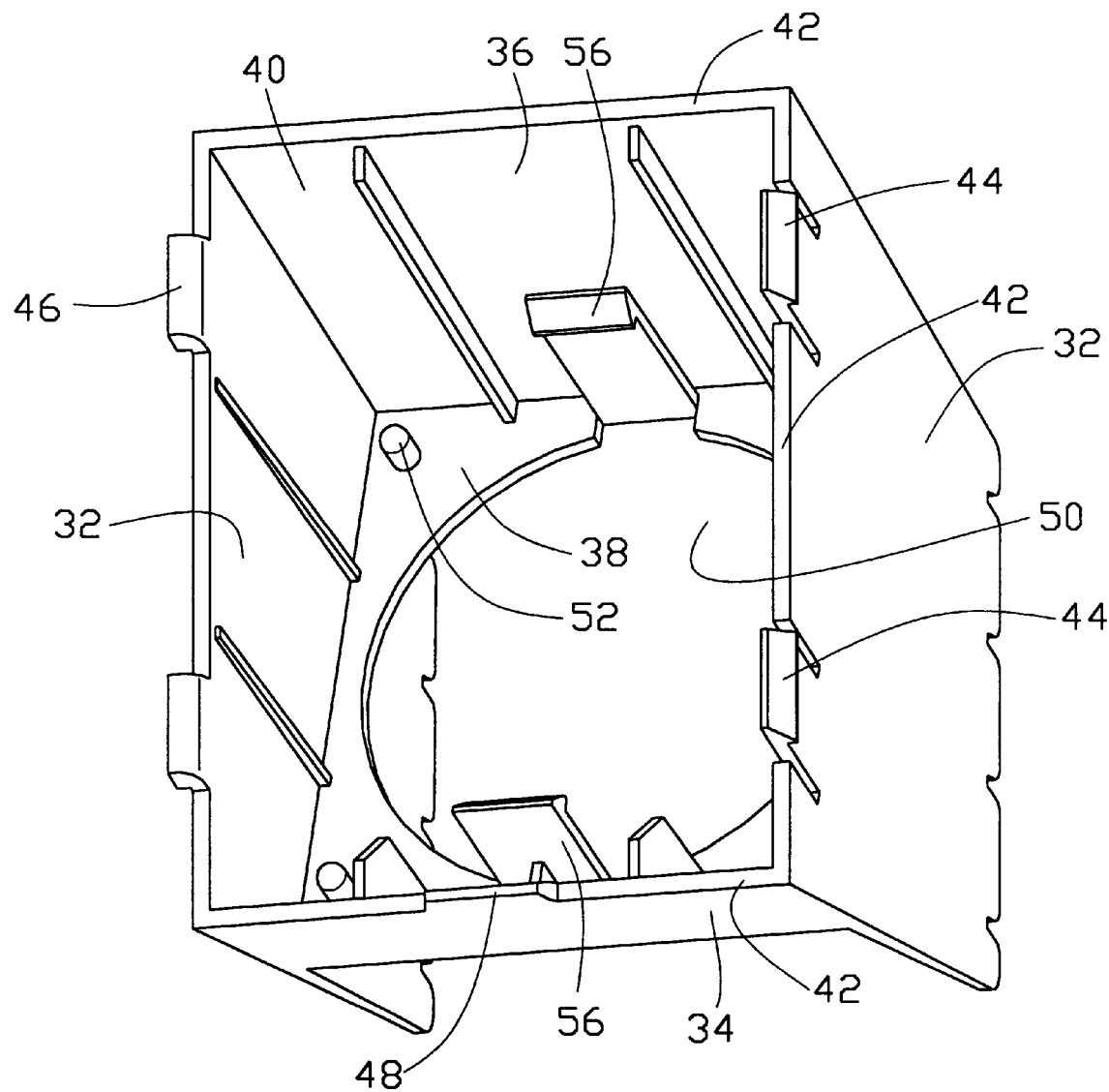
FIG. 3 is a perspective view of a fan housing.
Figure 4:
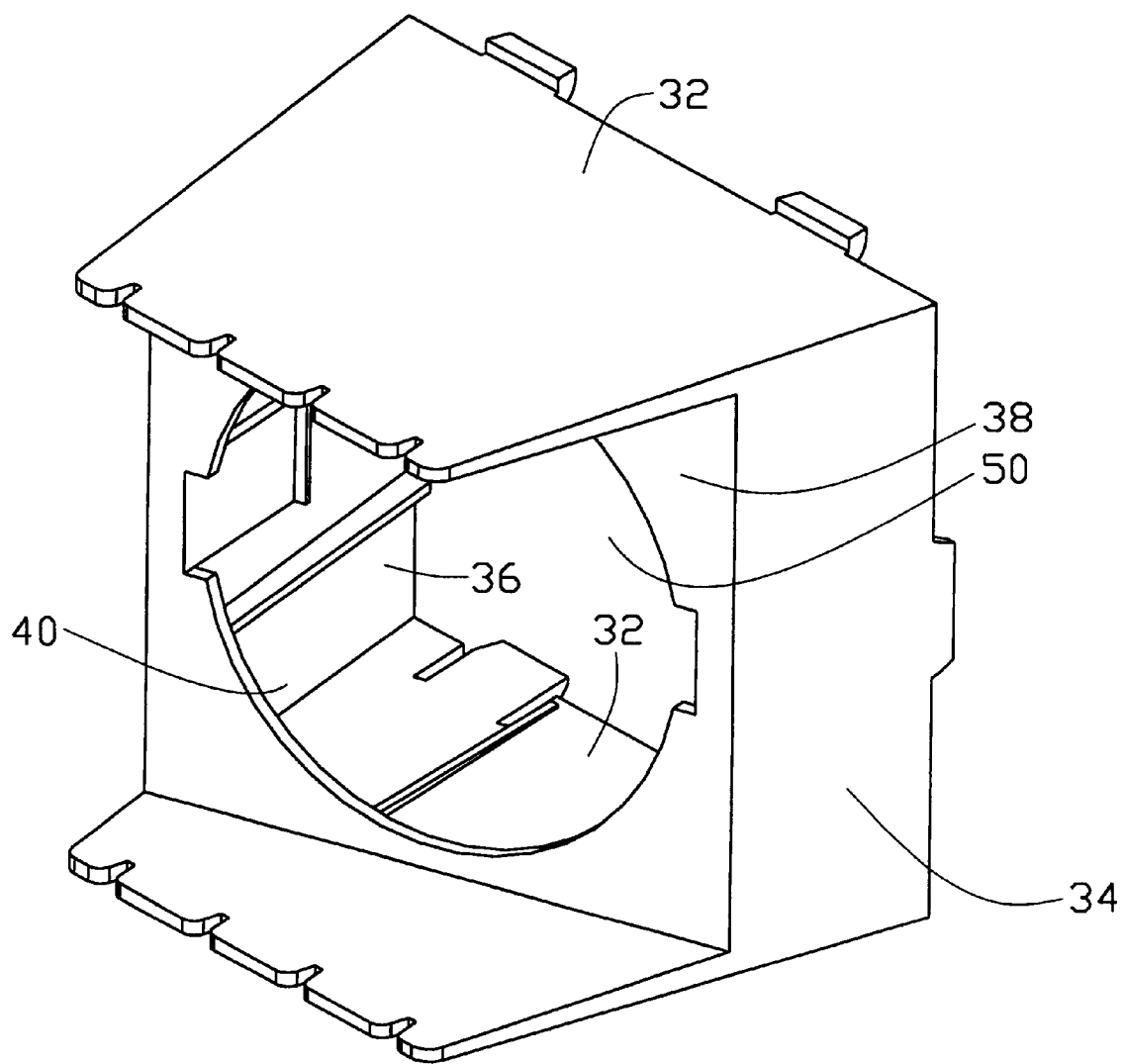
FIG. 4 is another perspective view of the fan housing taken from a different angle of FIG. 3.
Figure 5:
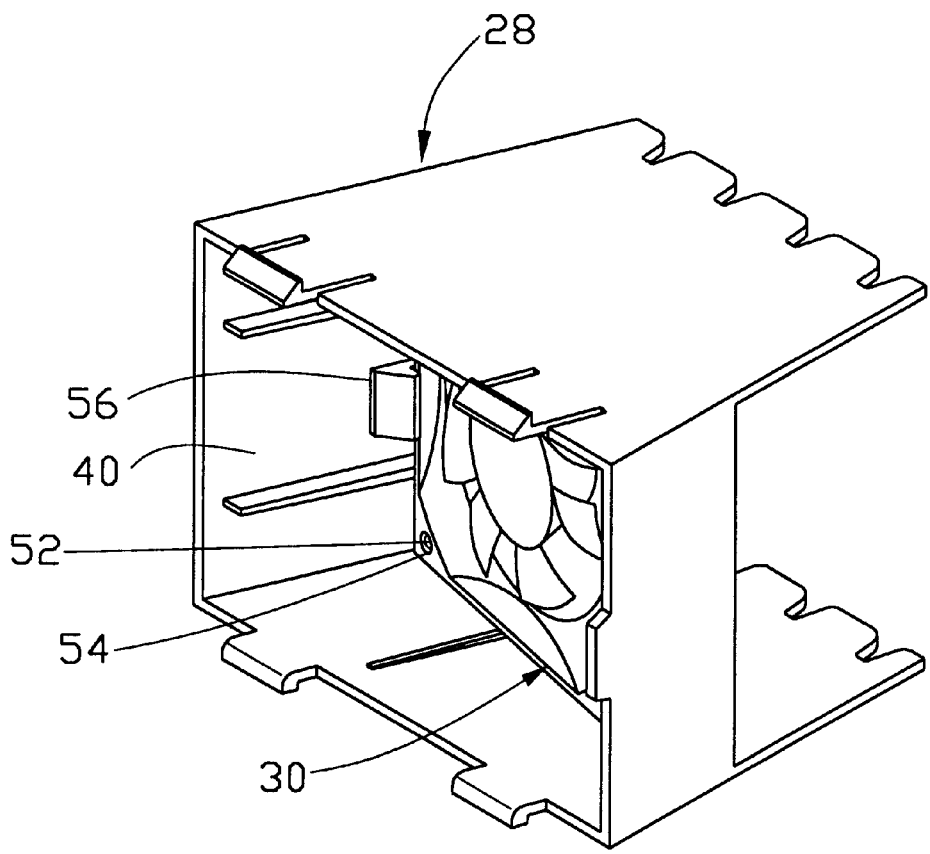
FIG. 5 is an assembled view of FIG. 2.

FIG. 1 shows a computer enclosure assembly 2 of the present invention including a computer enclosure 4 (partially shown), a fan assembly 6 attached to the computer enclosure 4, a mother board 8 mounted on the computer enclosure 4 and a power supply 10 attached to the computer enclosure 4. The computer enclosure 4 includes a front panel 12, a rear panel 14 and a side panel 16 connecting between the front and rear panels 12, 14. The front panel 12 defines two pairs of longitudinal slots 18 and a lateral slot 20 for engaging with the fan assembly 6. A plurality of apertures 22 is defined among the slots 18, 20 of the front panel 12. The power supply 10 is attached to a top portion of the rear panel 14 defining a plurality of apertures 24 adjacent to the power supply 10. The mother board 8 mounted on a bottom portion of the side panel 16 has a central processing unit 26 at a central portion thereof.

Referring to FIGS. 1–5, the fan assembly 6 includes a fan housing 28 and a fan 30 received in the fan housing 28. The fan housing 28 includes a pair of side walls 32, and top and bottom walls 34, 36. An end wall 38 is formed at the fan housing 28 connecting to the side walls 32 and top and bottom walls 34, 36 for defining a receiving space 40 to receive the fan 30. The fan housing 28 forms four fixing edges 42 respectively in the side walls 32 and the top and bottom walls 34, 36. The end wall 38 is inclined to a plane in which the four fixing edges 42 lie. A pair of latches 44 and a pair of tabs 46 respectively extend from the side panels 32 beyond the fixing edges 42 of the side panels 32 for engagingly extending through the longitudinal slots 18 of the computer enclosure 4. A positioning plate 48 extends from the fixing edge 42 of the top wall 34 for extending into the lateral slot 20 of the computer enclosure 4.

The biasing end wall 38 defines an opening 50 for providing access to air aspirated by the fan 30. Four posts 52 extend from an inner surface of the end wall 38 for insertion into positioning holes 54 defined in the fan 30. A pair of fan locks 56 extends from the inner surface of the end wall 38 for locking the fan 30. Thus, the fan 30 receives the posts 52 of the fan housing 28 and is fixed by the fan locks 56 to form the fan assembly 6.

Figure 6:
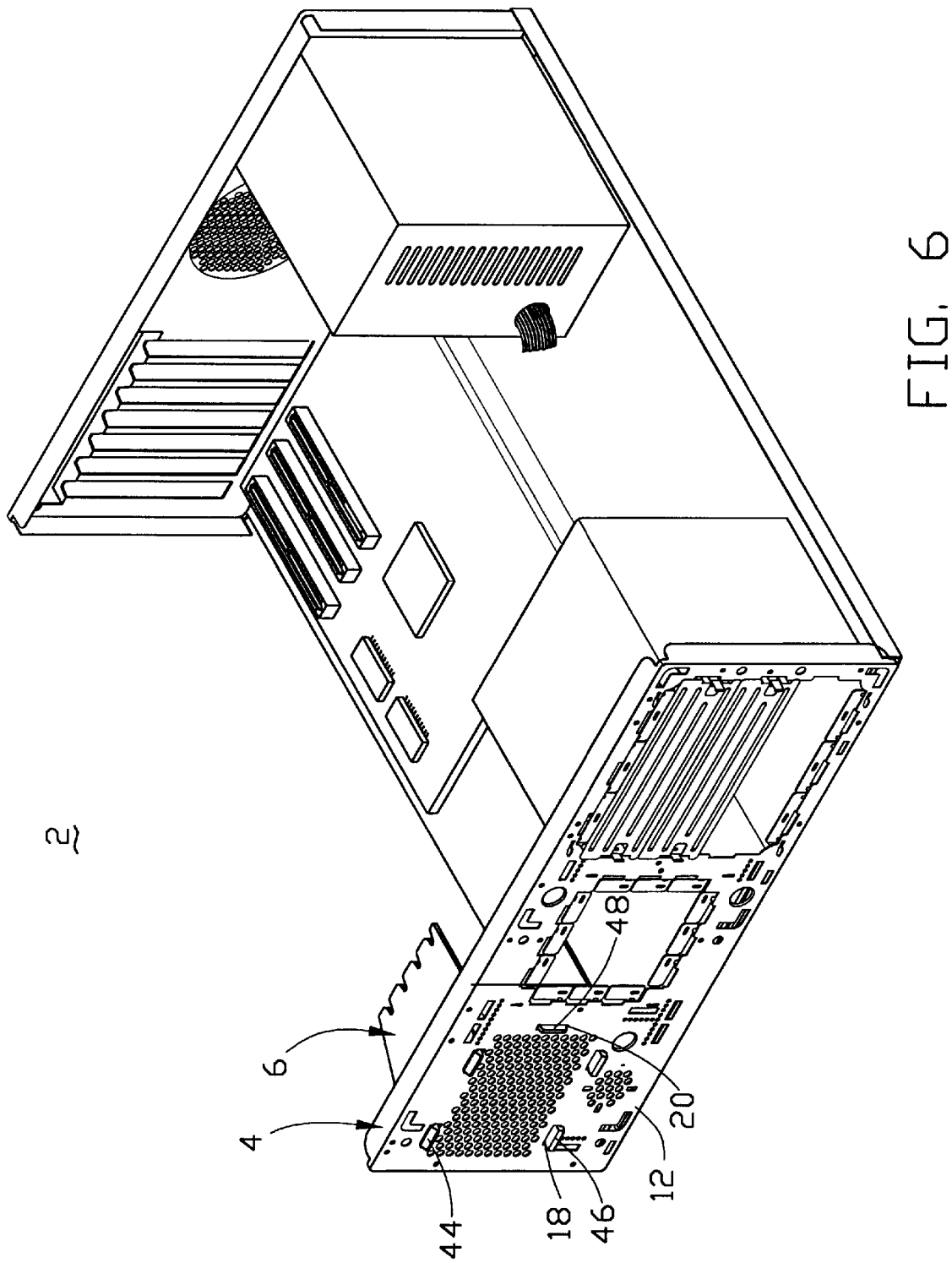
FIG. 6 is an assembled view of FIG. 1.

Referring to FIG. 6, in assembly, the positioning plate 48 of the fan assembly 6 extends into the lateral slot 20 of the front panel 12 of the computer enclosure 4. The latches 44 and the tabs 46 respectively extend through the longitudinal slots 18 of the computer enclosure 4 and engage with the computer enclosure 4. Thus, the fan assembly is easily attached to the computer enclosure 4.

Figure 7:
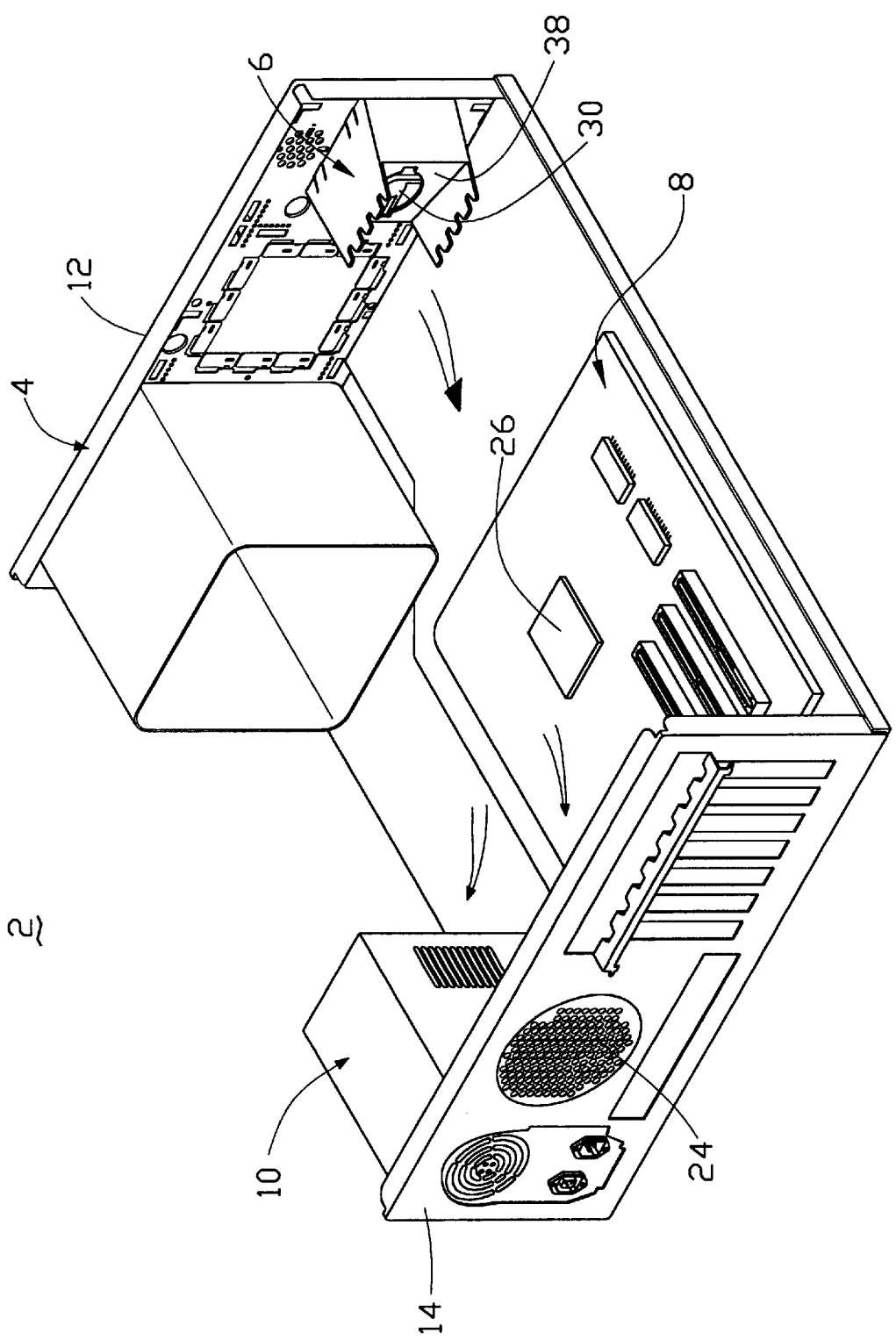
FIG. 7 is another perspective view of FIG. 6 taken from a different angle.

FIG. 7 shows air aspirated from the fan assembly 6 directly flows through the central processing unit 26 of the mother board 8 and then out of the computer enclosure 4 through the power supply 10 and the apertures 24 in the rear panel 14 of the computer enclosure 4 (shown by arrow), since the fan 30 is inclined to the front panel 12 due to the biasing end wall 38. Thus, an efficient convection is formed and heat accumulated in the central processing unit 26 is readily dissipated.

It is understood that the invention may be embodied in other specific forms without departing from the spirit of the central characteristics thereof. Thus, the present examples and embodiments are to be considered in all respects as illustrative and not restrictive, and the invention is not to be limited to the details given herein.

What is claimed is:

1. A fan housing attached to a computer enclosure for receiving a fan, comprising:

two side walls each having a fixing edge adapted for abutting against the computer enclosure;

top and bottom walls respectively connecting between the side walls; and an end wall formed among the two side walls and the top and bottom walls to define a receiving space for receiving a fan, the end wall being inclined relative to a plane in which the fixing edges of the side walls lie, the end wall defining an opening for providing access to air aspirated by the fan.

2. The fan housing as described in claim 1, wherein the end wall includes a plurality of posts for extending into the fan.

3. The fan housing as described in claim 1, wherein a fan lock extends from the end wall for fixing the fan.

4. A computer enclosure assembly comprising:

a computer enclosure comprising a panel defining a plurality of slots;

a fan assembly attached to the panel of the computer enclosure, the fan assembly comprising a fan housing attached to an inner surface of the panel by engaging with the slots of the panel, and a fan received in the fan housing, the fan housing having two side walls and an end wall connecting between the side walls and inclined relative to the inner surface of the panel; and a mother board mounted on the computer enclosure and having a central processing unit at a central portion thereof, air aspirated from the fan assembly directly flowing through the central processing unit.

5. The computer enclosure assembly as described in claim 4, wherein the end wall of the fan housing includes a plurality of posts for extending into the fan.

6. The computer enclosure assembly as described in claim 4, wherein a fan lock extends from the end wall of the fan housing for fixing the fan.

7. A computer enclosure assembly comprising:

an enclosure defining a vertical panel with a plurality of ventilation apertures therein, a plurality of slots around said apertures;

a fan housing defining an end wall with a large opening and a plurality of post extending inwardly from an inner surface therearound, a plurality of fan locks extending inwardly away from said end wall, a plurality of positioning tabs and latches formed around a front edge thereof;

a fan defining a plurality of positioning holes receiving the corresponding posts therein, the fan locks locking the fan in position in the fan housing, said fan housing attached to the vertical panel with the positioning tabs and latches respectively received within the corresponding slots for securement therebetween; wherein said end wall is spaced from said front edge in a direction which is perpendicular to said vertical panel, said end wall is inclined relative to said vertical panel, and the fan is obliquely spatially disposed, relative to said vertical panel, in the fan housing.

* * * * *